United States Patent [19]

Yoshino et al.

[11] 4,064,454

[45] Dec. 20, 1977

[54] CORONA DISCHARGE DETECTING DEVICE

[75] Inventors: Hironori Yoshino, Takarazuka; Kohei Sato, Kawanishi, both of Japan

[73] Assignee: Matsushita Electric Industrial Co., Ltd., Kadoma, Japan

[21] Appl. No.: 649,198

[22] Filed: Jan. 14, 1976

Related U.S. Application Data

[63] Continuation of Ser. No. 441,832, Feb. 12, 1974, abandoned.

[30] Foreign Application Priority Data

Feb. 14, 1973 Japan .................................. 48-18806
Feb. 14, 1973 Japan .................................. 48-18807
Feb. 15, 1973 Japan .................................. 48-18934
Feb. 19, 1973 Japan .................................. 48-19981
Feb. 19, 1973 Japan .................................. 48-19982

[51] Int. Cl.² ......................................... G01R 31/12

[52] U.S. Cl. ...................................... 324/54; 324/102; 358/10

[58] Field of Search .................... 324/54, 102, 133; 358/10

[56] References Cited

U.S. PATENT DOCUMENTS

| 3,015,774 | 1/1962 | Eigen | ..................... 324/54 |
| 3,727,129 | 4/1973 | Hummert | ..................... 324/54 |

*Primary Examiner*—Rudolph V. Rolinec
*Assistant Examiner*—Ernest F. Karlsen
*Attorney, Agent, or Firm*—Stevens, Davis, Miller & Mosher

[57] ABSTRACT

There is provided a device for detecting corona discharges generated in a high voltage generator which is operated by high frequency pulses, for example in a high voltage transformer which is used in the horizontal deflection circuit of a television receiver.

1 Claim, 8 Drawing Figures

CORONA DISCHARGE DETECTING DEVICE

This is a continuation of application Ser. No. 441,832 filed Feb. 12, 1974, now abandoned.

This invention relates to a device or a circuit arrangement for detecting corona discharges occurring in a high voltage generating means which is operated by high frequency pulses, for example, in a high voltage transformer which is used in the horizontal deflection circuit of a television receiver.

Although many technologies have been well established which provide circuits or device for detecting corona discharges in power electric machines operating at commercial frequency, such prior art methods have not been capable of detecting corona discharges occurring in a high voltage and high frequency pulse generator; for example, in a high voltage generating means such as used in the horizontal deflection and high voltage output circuits of a television receiver. This fact is considered to be due to the following reasons.

1. In the case of a television receiver, since the high voltage output circuits used in the horizontal deflection and high voltage generating circuit are driven by high frequency pulses, i.e. so called flyback pulses, which have an extremely sharp rise characteristic, it is not possible to separate these high frequency pulses or their higher harmonic components from the signal pulses generated by corona discharges and to observe the latter only. It is apparent that higher harmonic components existing in non-sinusoidal high frequency pulses, being difficult to separate, have a similar effect to that of corona pulses.

2. In television receiver, other various kinds of high frequency pulses than the flyback pulses, such as synchronous pulses and video signals etc, exist. They can be noise signals disturbing the corona signal pulses.

3. The prior art corona detecting device has been directed to corona discharges generated by sinusoidal wave voltages with a frequency of several tens to several hundreds of hertz. Whereas it is easy to separate corona signal pulses from this type of voltage waveform, it is totally impossible to detect corona discharges occurring in a flyback transformer which is driven by flyback pulses by means of such prior art means.

In view of the above mentioned present state, an object of this invention is to make it possible to detect corona discharges in a flyback transformer using the arrangements described hereinafter.

According to this invention, it is made possible to measure corona discharges appearing in the horizontal deflection and high voltage output circuits in the operating state, which has not been possible at all by means of prior art commercial frequency corona detecting devices. The inventive corona discharge detecting device is largely effective for the complete insulation design of flyback transformer etc. and stabilization of quality.

Explanation of a device according to this invention consisting of the following arrangement will be made hereinafter by taking as an example a case of corona discharge detection in a flyback transformer.

Other objects, features and advantages of the present invention will become apparent from the following description taken in conjunction with the accompanying drawings, in which.

Figure 1:
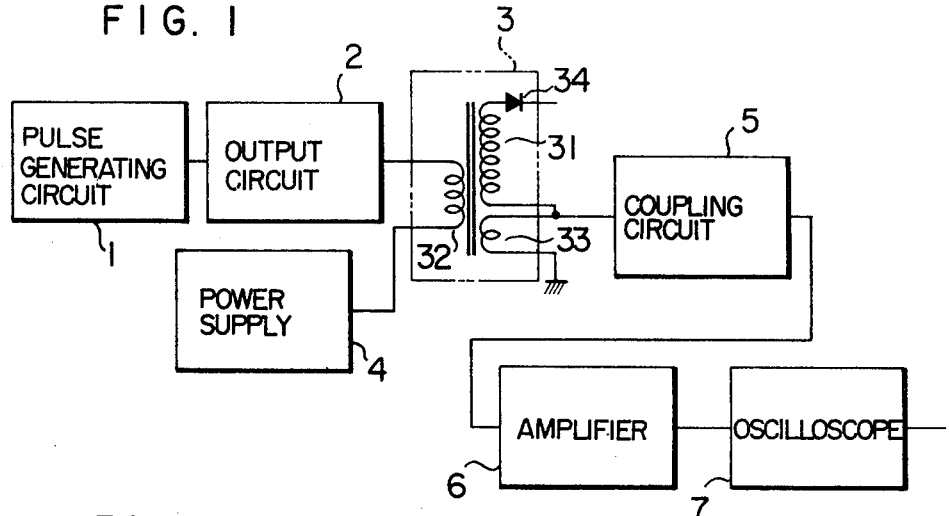
FIG. 1 is a block diagram showing the fundamental arrangement of a corona discharge detecting device according to this invention.
Figure 2A:
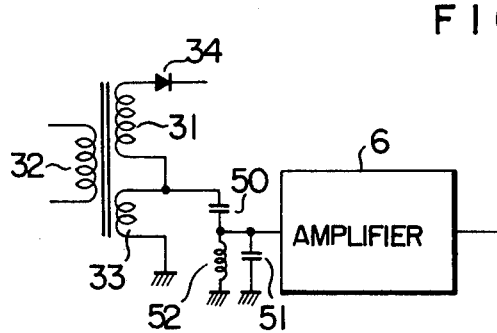
FIGS. 2a to 2d show several embodiments of tuned type coupling circuits.
Figure 2B:
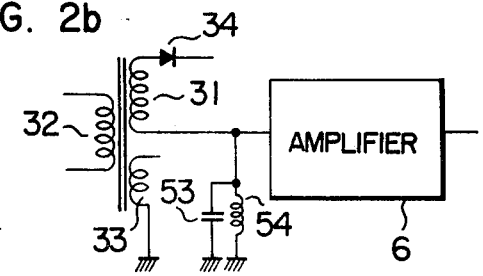
Figure 2C:
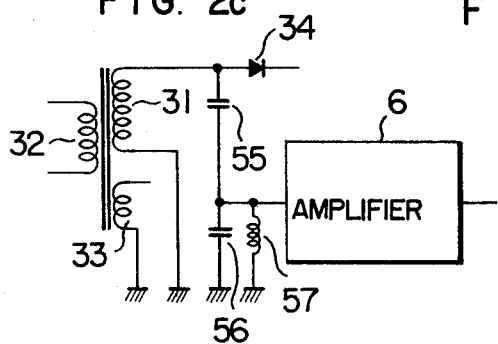
Figure 2D:
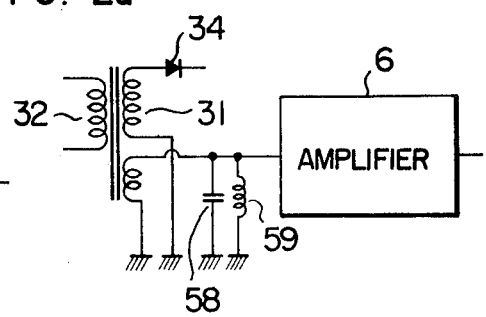

In FIG. 1, a flyback transformer 3 consisting of a primary coil 32, a secondary coil (high voltage coil) 34, a third coil 33, and a diode 31 etc. is driven by a horizontal deflection pulse generating circit 1 and a high voltage output circuit 2. The power supply 4 supplys a d.c. current to the circuits 1 and 2. The corona signals occurring in the flyback transformer are displayed on the Braun tube of oscilloscope 7 after passing through the low voltage side of the secondary coil and a tuned type coupling circuit 5 and amplified by a tuned type amplifier 6. It is necessary that the horizontal deflection pulse generating circuit 1 generates only pulses required for driving the flyback transformer. The existence of the other pulses is not desired, as they decrease the signal to noise (S/N) ratio of corona signals. For example, the horizontal deflection pulses may be independent pulses with a repetition frequency of about 15.75 KHz which are not synchronized with the horizontal synchronizing pulses. By eliminating all the pulses other than these 15.75 KHz pulses from the detection system, a good S/N ratio may be obtained. Through this countermeasure the circuits as employed in the ususal television receiver may be used for the horizontal deflection pulse generating circuit 1 and the high voltage output circuit 2. If the sweep of the horizontal axis of oscilloscope 7 is done in external trigger mode by the same flyback pulses which drive the flyback transformer 3, the noise signals such as higher harmonic components of flyback pulses leaking from the coupling circuit 5 and the amplifier 6 appear still on the Braun tube completely synchronized with the horizontal sweep. It is very easy to discriminate them from unsynchronized unstable corona signals.

FIGS. 2a to 2d show embodiments of a tuned type coupling circuit 5, in which 50, 51, 53, 55, 56 and 58 are capacitance elements and 52, 54, 57 and 59 are inductance elements. The embodiment shown in FIG. 2c demonstrates a case where the tuned type coupling circuit is connected to the high voltage side of secondary coil 31. The setting of the central frequency of the tuned type coupling circuit and tuned type amplifier 6 is an important problem related to the S/N ratio of the corona signal pulses. In the present case of a flyback transformer having a repetition frequency of 15.75 KHz, if the central frequency is set below 4.2 MHz, the corona pulse can not be discriminated from higher harmonics components of flyback pulses. On the other hand, if it is set above 50 MHz, the gain of the tuned type amplifer becomes unsatisfactory, reducing the measuring sensitivity. It is preferable to set the central frequency between 4.2 MHz and 50 MHz.

Figure 3:
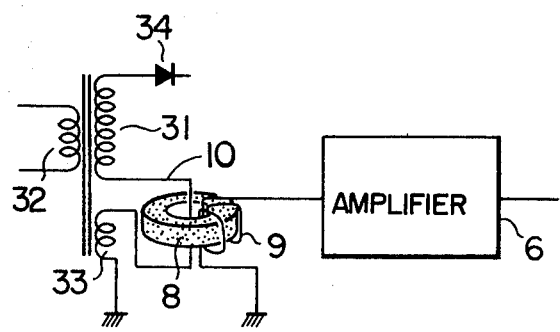
FIG. 3 shows a further embodiment of coupling method different from those of FIGS. 2a to 2d.

FIG. 3 shows another embodiment of the coupling method, in which a one-turn coil 10 constituted by an end of the secondary coil of the flyback transformer and a detecting coil 9 are coupled magnetically by means of a magnetic core 8 and then coupled to a tuned type amplifer 6.

Figure 4:
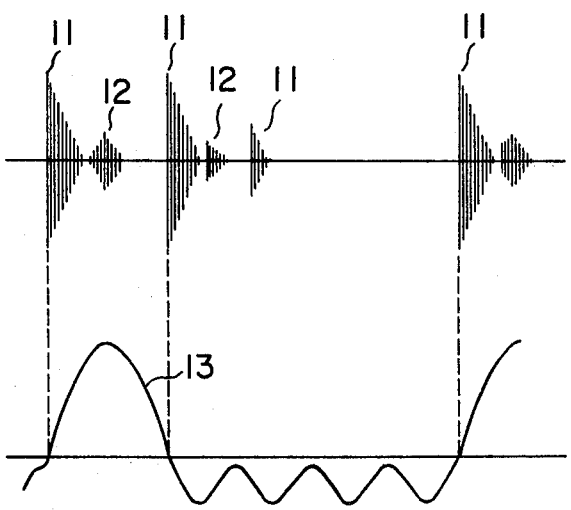
FIG. 4 shows observed waveforms appearing on a Braun tube of an oscilloscope.

FIG. 4 shows examples of waveforms observed on the Braun tube of an oscilloscope, the upper trace being the output obtained from the tuned type amplifier 6. 11 indicates higher harmonics components of the flyback pulses, which are completely synchronized with the sweep of the horizontal axis. 12 indicates corona signal pulses, which are easy to identify since they are not synchronized. The lower trace shows flyback pulses for correcting the phase of the output waveform.

Figure 5:
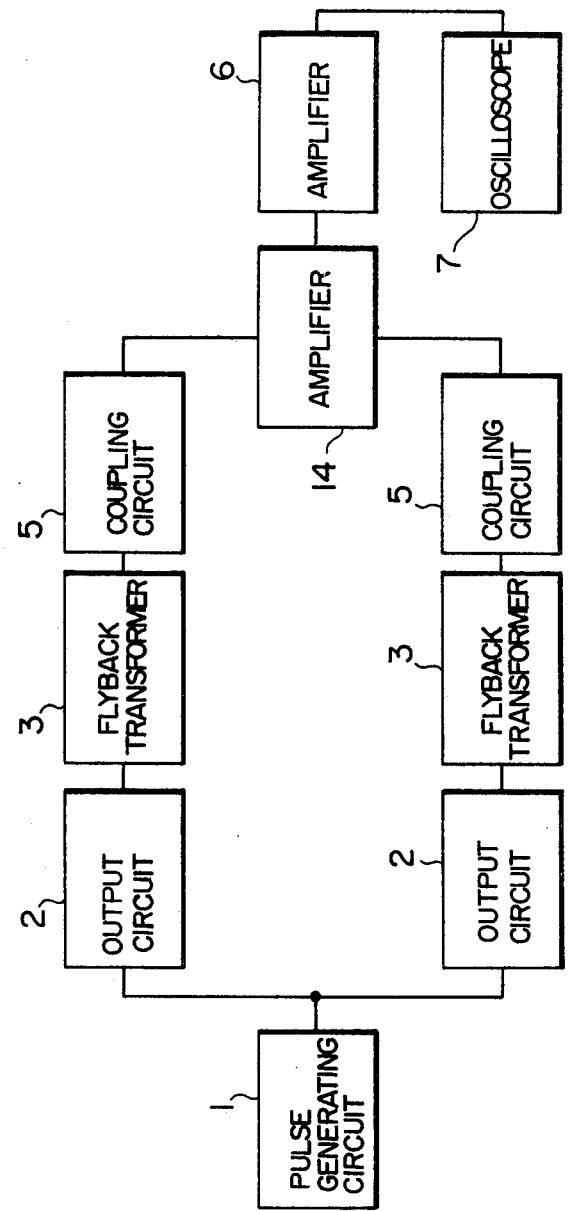
FIG. 5 shows another embodiment of this invention.

FIG. 5 shows another embodiment of the circuit arrangement. Pulses generated from a horizontal deflection pulse generating circuit 1 are coupled to each of high voltage output circuits 2 to drive two independent flyback transformers 3 simultaneously, and via coupling circuits 5 having the same characteristic, are coupled to both input terminals of a differential amplifier 14. The output of the differential amplifier is led to the oscilloscope 7 through an amplifier 6. The flyback pulses and their higher harmonic components appear at both input terminals of the differential amplifier 14 at the same level and phase so that they are cancelled, while corona signal pulses having different levels and phases are not cancelled but amplified to be displayed on the Braun tube of an oscilloscope. It is needless to say that this method is equally effective for a case when a corona discharge occurs only in one of two flyback transformers.

Although explantion has been made of some embodiments of this invention by taking a television receiver as an example, it is apparent that the same effect may be obtained by using the same arrangement for other high voltage generating means which are operated by high frequency pulses.

What we claim is:

1. A corona discharge detecting device comprising:
   a horizontal deflection pulse generating circuit;
   a high voltage output circuit coupled to said pulse generating circuit for generating output pulses having frequency components in the same frequency range as said corona discharge;
   a flyback transformer including a primary coil coupled to said high voltage output circuit, a high voltage coil and a third coil;
   a tuned coupling circuit tuned to a frequency between 4.2 MHz and 50 MHz, said tuned coupling circuit including a magnetic core having an opening therein, a conductor connecting the high voltage and third coils of said flyback transformer passing through said opening, and a detecting coil wound on said core;
   a tuned amplifier coupled to the detecting coil of said flyback transformer, said tuned amplifier being tuned to the same frequency as said coupling circuit; and
   an oscilloscope having its input connected to the output of said tuned amplifier, corona pulses occurring in said flyback transformer being displayed on said oscilloscope as unsynchronized pulses.

* * * * *